(12) United States Patent
Lim et al.

(10) Patent No.: US 8,101,025 B2
(45) Date of Patent: Jan. 24, 2012

(54) METHOD FOR CONTROLLING CORROSION OF A SUBSTRATE

(75) Inventors: Eu Jin Lim, Santa Clara, CA (US);
Chungdee Pong, Los Altos, CA (US);
Changhun Lee, San Jose, CA (US);
Mark Kawaguchi, Sunnyvale, CA (US);
Guowen Ding, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1088 days.

(21) Appl. No.: 11/363,833

(22) Filed: Feb. 27, 2006

(65) Prior Publication Data
US 2006/0137710 A1 Jun. 29, 2006

Related U.S. Application Data

(63) Continuation-in-part of application No. 10/446,332, filed on May 27, 2003.

(51) Int. Cl.
*B08B 7/04* (2006.01)
*B08B 7/00* (2006.01)

(52) U.S. Cl. .............. 134/1.2; 134/1.1; 134/30; 134/26; 438/906

(58) Field of Classification Search .............. 134/1, 1.1, 134/22.1, 22.18, 26, 30, 1.2, 1.3; 438/905, 438/906
See application file for complete search history.

(56) References Cited

U.S. PATENT DOCUMENTS

| | | | |
|---|---|---|---|
| 3,917,710 A | 11/1975 | Pond et al. | |
| 4,325,984 A | 4/1982 | Galfo et al. | |
| 5,174,856 A | 12/1992 | Hwang et al. | |
| 5,200,031 A | 4/1993 | Latchford et al. | |
| 5,200,361 A | 4/1993 | Onishi | |
| 5,221,424 A | 6/1993 | Rhoades | |
| 5,360,995 A | 11/1994 | Graas | |
| 5,425,843 A | 6/1995 | Saul et al. | |
| 5,545,289 A * | 8/1996 | Chen et al. | 438/694 |
| 5,620,559 A | 4/1997 | Kikuchi | |
| 5,913,336 A | 6/1999 | Ingram | |
| 6,063,300 A | 5/2000 | Suzuki et al. | |

(Continued)

FOREIGN PATENT DOCUMENTS

WO 00/24048 A1 4/2000

(Continued)

OTHER PUBLICATIONS

Notice of Final Rejection dated Jun. 2, 2008 for Korean Patent Application No. 10-2007-0019174.

(Continued)

*Primary Examiner* — Alexander Markoff
(74) *Attorney, Agent, or Firm* — Alan Taboada; Moser Taboada (57) ABSTRACT

A method for controlling corrosion of a substrate is provided herein. In one embodiment, a method for controlling corrosion of a substrate includes the steps of providing a substrate having a patterned photoresist layer with a metallic residue disposed thereon; exposing the substrate to a hydrogen-based plasma to remove the metallic residue; and removing the photoresist. The metallic residue may comprise residue from etching at least one of aluminum or copper. The metallic residue may further comprise a halogen compound from etching a metal-containing layer with a halogen-based process gas. The hydrogen-based plasma may comprise hydrogen ($H_2$) and may further comprise at least one of nitrogen ($N_2$) and water ($H_2O$) vapor. The hydrogen-based plasma may further comprise an inert gas, such as argon (Ar).

30 Claims, 4 Drawing Sheets

U.S. PATENT DOCUMENTS

| | | |
|---|---|---|
| 6,080,529 A | 6/2000 | Ye et al. |
| 6,107,215 A | 8/2000 | Fujimura et al. |
| 6,153,530 A * | 11/2000 | Ye et al. ............ 438/720 |
| 6,276,997 B1 | 8/2001 | Li |
| 6,284,666 B1 | 9/2001 | Naeem et al. |
| 6,323,121 B1 | 11/2001 | Liu et al. |
| 6,436,475 B1 | 8/2002 | Adler et al. |
| 6,440,864 B1 | 8/2002 | Kropewnicki et al. |
| 6,475,298 B1 | 11/2002 | O'Donnell et al. |
| 6,536,449 B1 | 3/2003 | Ranft et al. |
| 6,562,416 B2 * | 5/2003 | Ngo et al. ............ 427/534 |
| 6,583,046 B1 * | 6/2003 | Okada et al. ............ 438/622 |
| 6,645,852 B1 * | 11/2003 | Taguchi et al. ............ 438/637 |
| 6,777,380 B2 | 8/2004 | Small et al. |
| 6,796,314 B1 | 9/2004 | Graff |
| 2002/0037820 A1 | 3/2002 | Small et al. |
| 2002/0127840 A1 * | 9/2002 | Smith et al. ............ 438/618 |
| 2004/0018715 A1 * | 1/2004 | Sun et al. ............ 438/622 |
| 2004/0237997 A1 | 12/2004 | Rui et al. |
| 2005/0158667 A1 | 7/2005 | Nguyen et al. |

FOREIGN PATENT DOCUMENTS

| | | |
|---|---|---|
| WO | 01/82355 A2 | 11/2001 |

OTHER PUBLICATIONS

Notice of First Office Action dated Aug. 1, 2008 for China Patent Application No. 2007100802731.

Notice of Second Office Action dated Jan. 16, 2009 for China Patent Application No. 2007100802731.

Notice of Third Office Action dated May 8, 2009 for China Patent Application No. 2007100802731.

* cited by examiner

METHOD FOR CONTROLLING CORROSION OF A SUBSTRATE

CROSS-REFERENCE TO RELATED APPLICATIONS

This application is a continuation-in-part of co-pending U.S. patent application Ser. No. 10/446,332, filed May 27, 2003 and entitled "Method for Removal of Residue From a Substrate," which is herein incorporated by reference in its entirety.

BACKGROUND OF THE INVENTION

1. Field of the Invention

The present invention generally relates to a method of fabricating devices on semiconductor substrates. More specifically, the invention relates to a method for removal of residue from a semiconductor substrate.

2. Description of the Related Art

Microelectronic devices are generally fabricated on a semiconductor substrate as integrated circuits wherein various metal layers are interconnected to one another to facilitate propagation of electrical signals within the device. One typical process used for fabrication of the microelectronic devices is a plasma etch process. During plasma etch processes, one or more layers that comprise a metal or a metal-based compound are removed, either partially or in total, to form a feature (e.g., interconnect line or contact via) of the integrated circuit.

Generally, plasma etch processes use gas chemistries that, when reacted with the material comprising the etched layer or etch mask, may produce non-volatile byproducts. Such byproducts accumulate on the substrate as a residue. In the art, such residue is commonly called a "post-etch residue." Post-etch residue may interfere with processing of the substrate, e.g., the residue may contaminate the remaining layers or cause difficulties in depositing subsequent layers. In addition, metal-containing residue may also cause short-circuits that disrupt or degrade operation of the integrated circuits.

Conventional methods for removing residue typically include multiple wet treatments of the substrate along with an intermediate plasma strip process using an oxygen-based chemistry. Multiple wet treatments, along with an intermediate plasma strip process (i.e., etch and strip processes), reduce productivity during fabrication of the microelectronic devices. Further, the oxygen-based plasma strip process may form hard to remove metal oxides on the substrate or otherwise corrode the substrate.

Therefore, there is a need in the art for an improved method for removing residue from a substrate during fabrication of microelectronic devices.

SUMMARY OF THE INVENTION

Embodiments of a method for controlling corrosion of a substrate is provided herein. In one embodiment, a method for controlling corrosion of a substrate includes the steps of providing a substrate having a patterned photoresist layer with a metallic residue disposed thereon; exposing the substrate to a hydrogen-based plasma to remove the metallic residue; and removing the photoresist. The metallic residue may comprise residue from etching at least one of aluminum or copper. The metallic residue may further comprise a halogen compound from etching a metal-containing layer with a halogen-based process gas. The hydrogen-based plasma may comprise hydrogen ($H_2$) and may further comprise at least one of nitrogen ($N_2$) and water ($H_2O$) vapor. The hydrogen-based plasma may further comprise an inert gas, such as argon (Ar).

In another embodiment, a method for controlling corrosion of a substrate having a mask layer atop a metal-containing layer, wherein a metallic residue from etching the metal-containing layer is disposed on the mask layer, includes the steps of (a) exposing the metallic residue to a hydrogen-based process gas in a non-plasma state for a first period of time; and (b) exposing the metallic residue to a hydrogen-based process gas in a plasma state for a second period of time. Step (a) may be performed before or after step (b). The mask layer may be removed after the completion of steps (a) and (b).

In yet another embodiment, a method for controlling corrosion of a substrate, includes etching a conductive layer of a substrate having a patterned photoresist layer formed thereover using a halogen-based process gas, wherein the etch process forms a metallic residue; and exposing the substrate to a hydrogen-based plasma to remove the metallic residue while heating the substrate within the same process chamber as used to etch the conductive layer.

BRIEF DESCRIPTION OF THE DRAWINGS

The teachings of the present invention will become apparent by considering the following detailed description in conjunction with the accompanying drawings, in which.

Where possible, identical reference numerals are used herein to designate identical elements that are common to the figures. The images in the drawings are simplified for illustrative purposes and are not depicted to scale.

The appended drawings illustrate exemplary embodiments of the invention and, as such, should not be considered as limiting the scope of the invention, which may admit to other equally effective embodiments.

DETAILED DESCRIPTION

The present invention is a method for removing residue from a substrate (e.g., silicon (Si) wafer, gallium arsenide (GaAs) wafer, and the like) during fabrication of a microelectronic device. In one application, the inventive method is used to remove post-etch residue that comprises at least one metal (e.g., copper (Cu), aluminum (Al), and the like), as well as compounds thereof.

Figure 1:
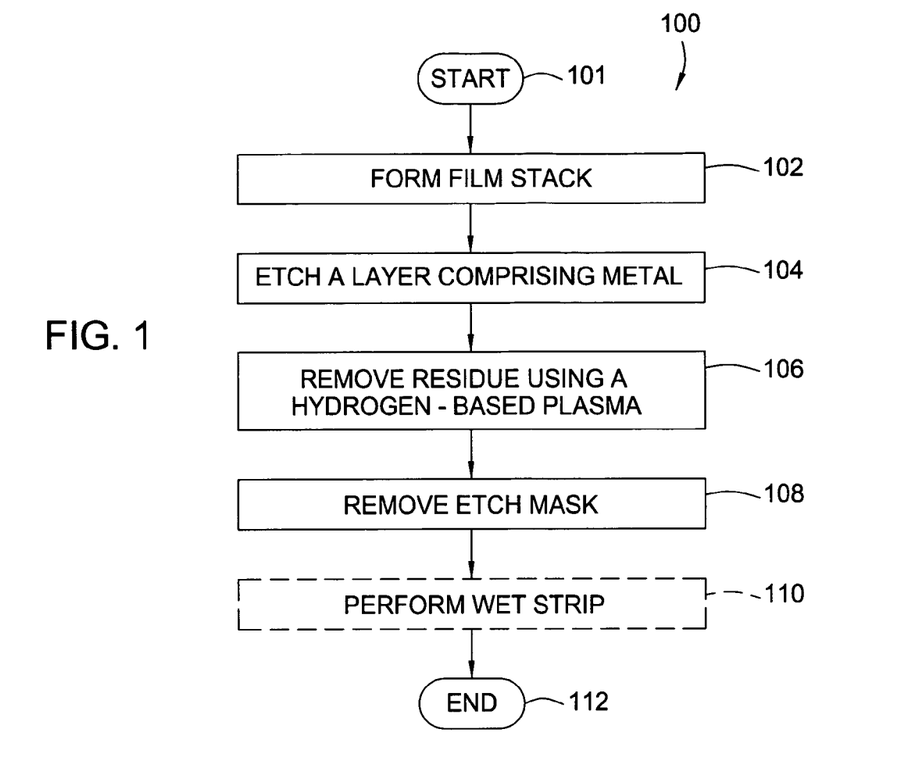
FIG. 1 depicts a flow diagram of a method for removing residue in accordance with one embodiment of the present invention.

FIG. 1 depicts a flow diagram of one embodiment of the inventive method for removal of residue as method 100. The method 100 includes processes performed upon a film stack having at least one metal layer.

FIGS. 2A-2D depict a series of schematic, cross-sectional views of a substrate having a film stack from which residue is removed using method 100. The cross-sectional views in FIGS. 2A-2D relate to individual processing steps performed upon the film stack. The images in FIGS. 2A-2D are not depicted to scale and are simplified for illustrative purposes.

Figure 2A:
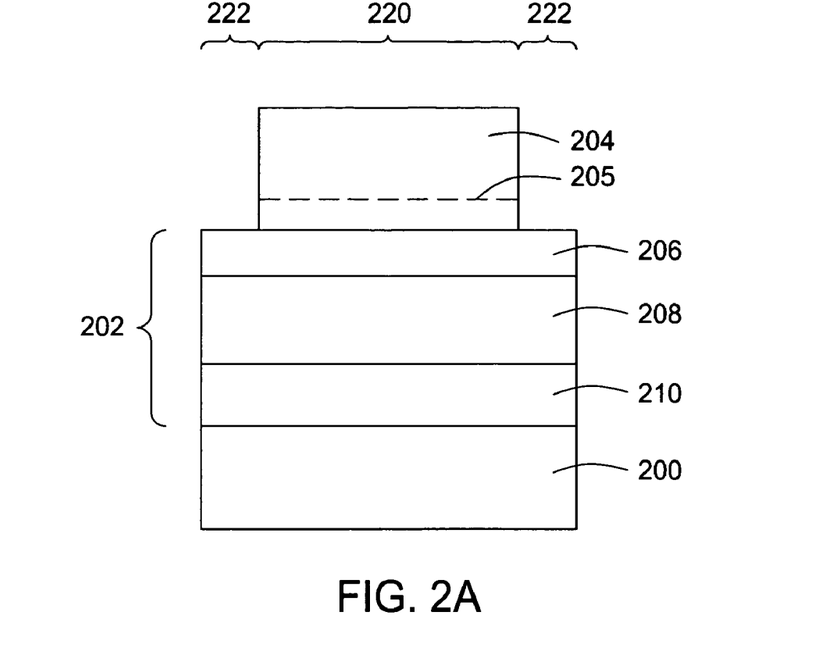
FIGS. 2A-2D depict a sequence of schematic, cross-sectional views of a substrate having a film stack where residue is removed in accordance with the method of FIG. 1.

The method 100 starts at step 101 and proceeds to step 102 where a film stack 202 and etch mask 204 are formed on a substrate 200, e.g., a silicon substrate (FIG. 2A). In one embodiment, the film stack 202 comprises a barrier layer 210, a metal-containing layer 208, and an insulating or conducting anti-reflection layer 206. The anti-reflection layer 206 facilitates control of the reflection of the light during exposure of the photoresist. The anti-reflection layer 206 minimizes inaccuracies in an etch mask pattern transfer process from optical limitations inherent to the lithographic process, such as light reflection, that become more prevalent as feature sizes are reduced.

The barrier layer 210 and the anti-reflection layer 206 are generally formed of a dielectric and/or conducting material, such as titanium (Ti), titanium nitride (TiN), tantalum (Ta), tantalum nitride (TaN), titanium tungsten (TiW), silicon nitride ($Si_3N_4$), silicon dioxide ($SiO_2$), hafnium dioxide ($HfO_2$), and the like. The thickness of the barrier layer 210 and the anti-reflection layer 206 may be any thickness as desired for the fabrication of a particular semiconductor device. In one embodiment, the barrier layer 210 and the anti-reflection layer 206 are formed to a total thickness of about 300 to greater than 1,000 Angstroms. The metal-containing layer 208 may be formed from any conductive metal or metallic compound. In one embodiment, the metal-containing layer 208 comprises aluminum (Al), copper (Cu), nickel (Ni), iron (Fe), and the like, or compounds thereof. The metal-containing layer 208 may further comprises non-metallic elements such as silicon (Si). The thickness of the metal-containing layer 208 may be any thickness as desired for the fabrication of a particular semiconductor device. In one embodiment, the metal-containing layer 208 is formed to a thickness of about 1,000 to 10,000 Angstroms.

The layers of the film stack 202 can be formed using any conventional thin film deposition technique, such as atomic layer deposition (ALD), chemical vapor deposition (CVD), plasma enhanced CVD (PECVD), physical vapor deposition (PVD), and the like. Fabrication of the microelectric devices may be performed using the respective processing reactors of, for example, CENTURA®, ENDURA®, and other semiconductor substrate processing systems available from Applied Materials, Inc. of Santa Clara, Calif.

The etch mask 204 is formed on the anti-reflection layer 206 (FIG. 2A). The etch mask 204 protects a region 220 of the film stack 202 while exposing adjacent regions 222 of the stack 202. Generally, the etch mask 204 is a photoresist mask that is fabricated using a conventional lithographic patterning process. For such process, a photoresist layer is exposed through a patterned mask, developed, and the undeveloped portion of the photoresist is removed. The photoresist mask 204 typically has a thickness of about 2,000 to 6,000 Angstroms.

Optionally, the etch mask 204 may be a hard mask, or the etch mask 204 may further comprise an optional hard mask layer 205 (as shown in phantom). The hard mask or hard mask layer 205 may be formed of silicon dioxide ($SiO_2$), silicon oxi-nitride (SiON), Advanced Patterning FiLM™ (APF) (available from Applied Materials, Inc. of Santa Clara, Calif.), hafnium dioxide ($HfO_2$), polyamides, and the like.

Processes of applying the etch mask 204 are described, for example, in commonly assigned U.S. Pat. No. 6,759,286, issued Jul. 6, 2004, and U.S. Pat. No. 6,573,030, issued Jun. 3, 2003, both of which are incorporated herein by reference.

Figure 2B:
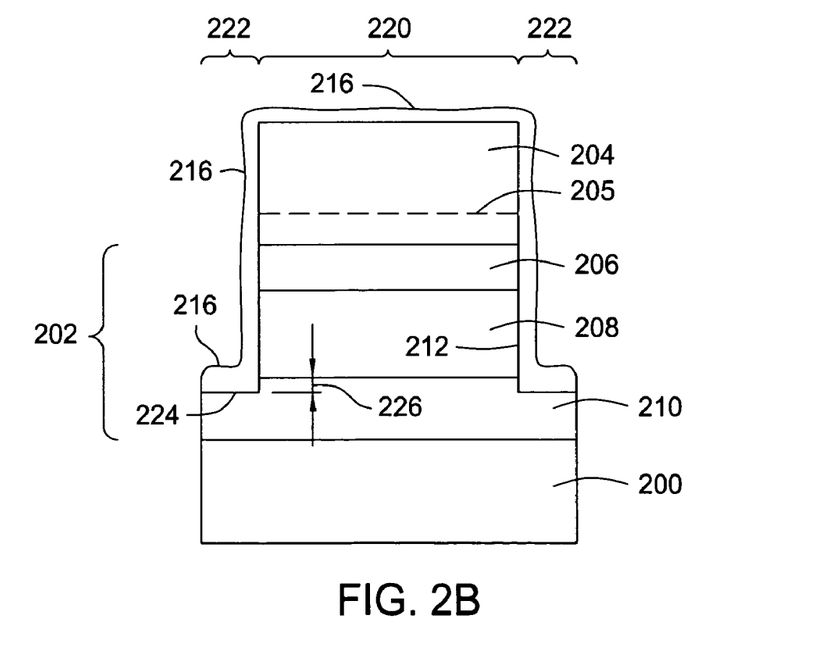

At step 104, the anti-reflection layer 206 and the metal-containing layer 208 are plasma etched and removed in the unprotected regions 222 (FIG. 2B). The anti-reflection layer 206 and the metal-containing layer 208 are typically etched using a halogenated process chemistry (i.e., a halogen-based process chemistry). In one embodiment, the anti-reflection layer 206 and the metal-containing layer 208 may be etched using a chlorine-based gas mixture. In one embodiment, the chlorine-based gas mixture may comprise chlorine ($Cl_2$) or boron trichloride ($BCl_3$). Optionally, the chlorine-based gas mixture may further comprise an inert diluent gas, such as at least one of argon (Ar), helium (He), neon (Ne), and the like. Optionally, the chlorine-based gas mixture may further comprise a small amount of a passivation gas, such as nitrogen ($N_2$), carbon tetrafluoride ($CF_4$), tri-fluoro hydrocarbon ($CHF_3$), methane ($CH_4$), acetylene ($C_2H_4$), and the like.

In one embodiment, step 104 uses the mask 204 as an etch mask and the barrier layer 210 as an etch stop layer. Specifically, during etching of the metal-containing film 208, the endpoint detection system of the etch reactor may monitor plasma emissions at a particular wavelength to determine an end of the etch process. The etch process may continue until a shallow recess 224 is formed in the barrier layer 210 (FIG. 2B). The shallow recess 224 may be formed to a depth 226 of about 200 to 1,000 Angstroms. The shallow recess 224 facilitates complete removal of the metal-containing layer 208 from the barrier layer 210 in the regions 222.

Step 104 can be performed in an etch reactor such as a Decoupled Plasma Source (DPS) reactor, or an Advantedge™ metal etch chamber that may be part of a CENTURA® processing system, commercially available from Applied Materials, Inc. of Santa Clara, Calif.

During step 104, some of the material removed from the anti-reflection layer 206 and the metal-containing layer 208 combine with components of the etchant gas mixture (e.g., halogen-containing gases, such as chlorine-containing, fluorine-containing gases, and the like), as well as with the components of the etch mask 204 (e.g., polymeric components, and the like) to form non-volatile compounds. At least some of these non-volatile compounds typically become re-deposited onto the substrate 200, forming a residue 216 (i.e., post-etch residue). After the etch process, the post-etch residue 216 is typically found on the etch mask 204, sidewalls 212 of the film stack 202 and elsewhere on the substrate 200. In addition, these halogenated by-products accumulate inside the process chamber surfaces, hereby degrading process chamber performance over time and reducing the mean time between cleaning of the process chamber. As such, the inventive method may be performed in the same chamber as the etch process, thereby cleaning the etch process chamber at the same time as the substrate.

When a metal-containing layer (i.e., layer 208) is etched during step 104, the post-etch residue 216 also comprises atoms of such metal (e.g., aluminum (Al), copper (Cu), and the like) and/or compounds of the metal (e.g., metal chlorides, metal fluorides, metal oxides, metal nitrides, and the like) that may be formed during the etch process. In one illustrative embodiment discussed herein, such metallic compounds may comprise AlxCly (where x and y are integers), AlxFy (where x and y are integers), and AlxOy (where x and y are integers), and the like. Metal-containing post-etch residue is generally more difficult to remove from the substrate than other types of residue. Such residue 216 is also considered a contaminant with respect to subsequent processing of the substrate 200.

Figure 2C:
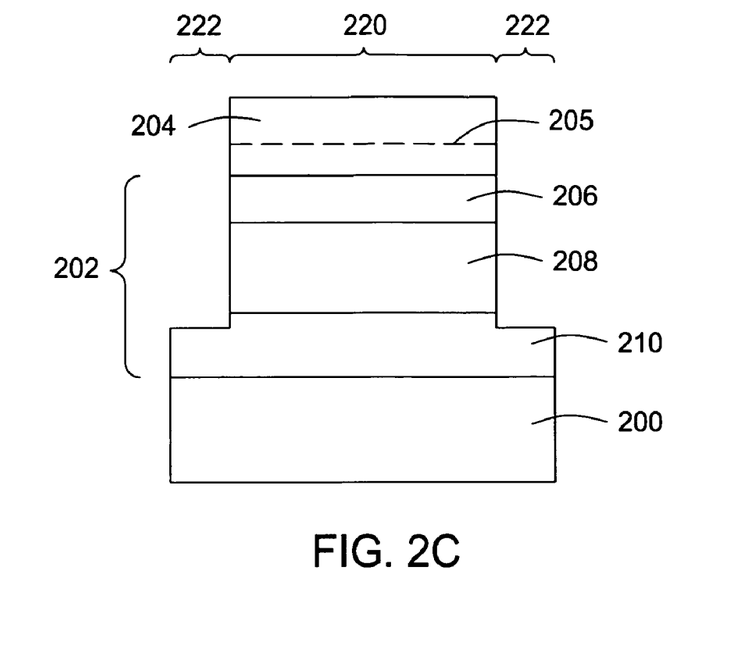

At step 106, the post-etch residue 216 is removed from the film stack 202 and the substrate 200 (FIG. 2C). In one embodiment, the post-etch residue 216 is removed using a hydrogen-based plasma. When the plasma is formed, atomic hydrogen from the process gas mixtures is useful in removing halogens, such as $Cl_2$, (to assist in corrosion control) as well as metals, such as Al, (to assist in polymer residue removal), which helps widen the corrosion control/polymer residue removal process window. The hydrogen-based plasma may be formed in any suitable manner now known or future developed. In one embodiment, the plasma is a remote plasma (i.e., the plasma is excited outside the reaction volume of the process chamber and the plasma constituents are directed to the process chamber), such as a microwave plasma excited at about 1.0 to 10 GHz or a radio frequency plasma excited at about 0.05 to 1,000 MHz.

In one illustrative embodiment, the hydrogen-based plasma is formed from water ($H_2O$) vapor. The use of $H_2O$ vapor assists in the control of corrosion of the metal-containing layers of the substrate while maintaining an acceptable level of polymer residue removal.

In another embodiment, the hydrogen-based plasma comprises $H_2$. Optionally, the plasma may further include at least one of nitrogen (e.g., $N_2$) or water ($H_2O$) vapor. In addition, the plasma may further optionally include an inert gas, such as argon (Ar).

In one embodiment, the post-etch residue 216 is removed by providing hydrogen ($H_2$) at a flow rate of about 100-5,000 sccm, applying RF power of about 500-6,000 W at approximately 270 KHz-1.5 GHz and maintaining a substrate temperature between about 100-400 degrees Celsius at a pressure in the process chamber of between about 500 mTorr-6 Torr. The duration of step 106 is generally between about 10-120 sec. One exemplary process provides $H_2$ at a rate of 800 sccm, applies RF power of 5,000 W, and maintains a substrate temperature of about 250 degrees Celsius at a chamber pressure of about 2.0 Torr.

Optionally, step 106 may further provide at least one of nitrogen ($N_2$) at a flow rate of up to about 1,000 sccm (i.e., a flow ratio between pure $H_2$ and about $1:10 H_2:N_2$) or water vapor ($H_2O$) at a flow rate of up to about 3,000 sccm (i.e., a flow ratio between pure $H_2$ and about $1:30 H_2:H_2O$). In another embodiment, step 106 may further provide at least one of nitrogen ($N_2$) at a flow ratio between pure $H_2$ and about $3:7 H_2:N_2$, or water vapor ($H_2O$) at a flow ratio between pure $H_2$ and about $1:9. H_2:H_2O$.

One exemplary process provides $H_2$ at a rate of 900 sccm and $N_2$ at a rate of 300 sccm (i.e., an $H_2:N_2$ flow ratio of about 3:1). Another exemplary process provides $H_2$ at a rate of 900 sccm and $H_2O$ at a rate of 300 sccm (i.e., an $H_2:H_2O$ flow ratio of about 3:1).

Optionally, an inert gas, such as argon (Ar) may be provided in a range of between about 0-3000 sccm (i.e., a flow ratio between pure $H_2$ and about $1:30 H_2:Ar$). Alternatively, argon (Ar) may be provided at a flow ratio between pure $H_2$ and about $3:7 H_2:H_2O$. In one embodiment, about 900 sccm of $H_2$ and about 900 sccm of Ar are provided (i.e., an $H_2:Ar$ flow ratio of about 1:1).

It has been discovered that a plasma formed from $H_2$ provides improved corrosion performance as compared to oxygen-based residue removal processes and improved or comparable to $H_2O$ vapor based residue removal processes. In addition, it has been discovered that the $H_2$ based residue removal process removes greater quantity of polymer residue as compared to oxygen-based and $H_2O$ vapor based residue removal processes. It has been further discovered that the $H_2$ based residue removal process results in improved corrosion control as compared to $H_2O$ vapor based residue removal processes (e.g., less corrosion and more consistent and repeatable process). Lastly, the $H_2$ based residue removal process reduces the total process time as compared to $H_2O$ vapor based processes. In short, the $H_2$ based residue removal process as disclosed herein provides a wider corrosion control/polymer residue removal process window and provides more flexibility with respect to fine tuning the process.

In addition, it has been discovered that much of the corrosion of the substrate spontaneously occurs during the initial stage of the post-etch residue removal process. It has further been discovered that ramping up the temperature of the substrate facilitates reducing the corrosion that may occur at this stage. Thus, as the specific heat capacity of $H_2$ is larger than that of $H_2O$ vapor, using $H_2$ can ramp up the substrate temperature faster than by using $H_2O$ vapor alone, thereby facilitating the prevention of spontaneous corrosion at the initial stage of post-etch treatment.

Figure 4:
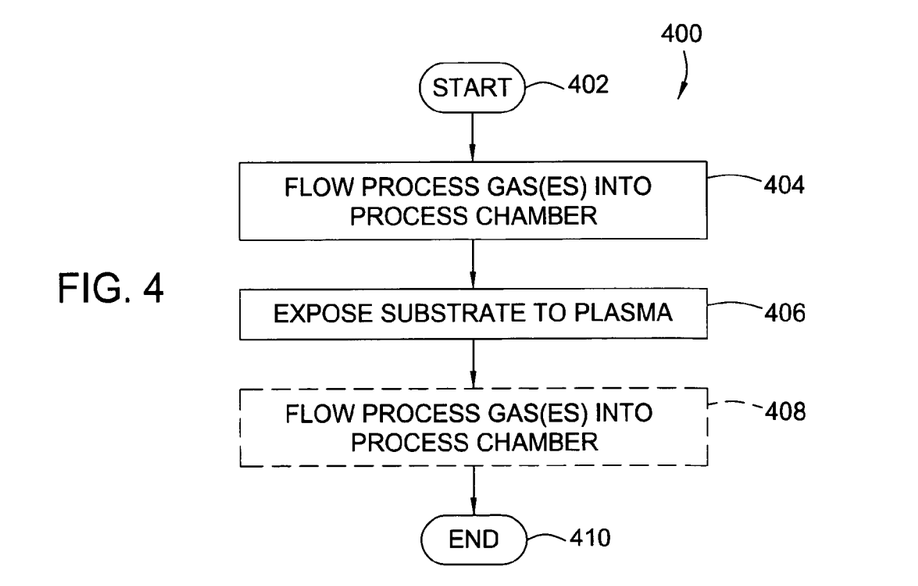
FIG. 4 depicts a flow diagram of a method for removing residue in accordance with another embodiment of the present invention.

Optionally, step 106 may further comprise a step of exposing the substrate to the process gas (to be understood herein as referring to a singular gas or a gas mixture) in a non-plasma state. For example, FIG. 4 depicts flow diagram of a method 400 for removing residue in accordance with another embodiment of the present invention.

The method 400 begins at step 402 and proceeds to step 404, where the process gas is flowed into the process chamber in a non-plasma state. The process gas may be any gas or gas mixture as described above with respect to step 106. The process gas may be flowed into the process chamber for at least 5 seconds, or in one embodiment, between about 5-40 seconds, in order to contact the residue 216 on the exposed surfaces of the substrate. The process gas, in a non-plasma state, reacts with components of the residue 216 (e.g., causing desorption and/or evaporation of the halogen containing metallic or halogen containing polymeric organic components). In one embodiment, $H_2$ is flowed into the process chamber for about 5-30 seconds.

Next, at step 406, a plasma is formed, as discussed above, and the substrate is exposed to the $H_2$ based plasma. Step 406 may have a duration of at least 10 seconds, or in one embodiment, between about 10-180 seconds. In one embodiment, after step 406, the method ends at step 410.

Optionally, and as shown in phantom as step 408, the process gas may again be flowed into the process chamber in a non-plasma state for the same duration as in step 404 in order to contact the residue 216 on the exposed surfaces of the substrate. Alternatively, steps 404 and 406 may be reversed—i.e., the residue may be treated with a plasma of the process gas for a first period of time and then subsequently exposed to the process gas in a non-plasma state for a second period of time, as discussed above.

Returning to FIG. 1, step 106 (and the method 400) can be performed in a reactor such as an AXIOM® reactor of the CENTURA® system. The AXIOM® reactor (described in detail with reference to FIG. 3 below) is a downstream plasma reactor in which a plasma is confined such that only reactive neutrals are provided to the reaction volume of the process chamber. Such plasma confinement minimizes plasma related damage of the substrate or circuits formed on the substrate. Alternatively, step 106 can be performed in a DPS reactor or an Advanced Strip and Passivation (ASP) reactor, both of which are commercially available from Applied Materials, Inc. of Santa Clara, Calif.

Using, for example, a CENTURA® system, upon completion of step 104, the substrate 200 may be transported, under vacuum, from the DPS reactor to the AXIOM® or other reactor for performing step 106. As such, the substrate is protected from contaminants that may be present in a non-vacuum portion of the manufacturing environment.

Figure 2D:
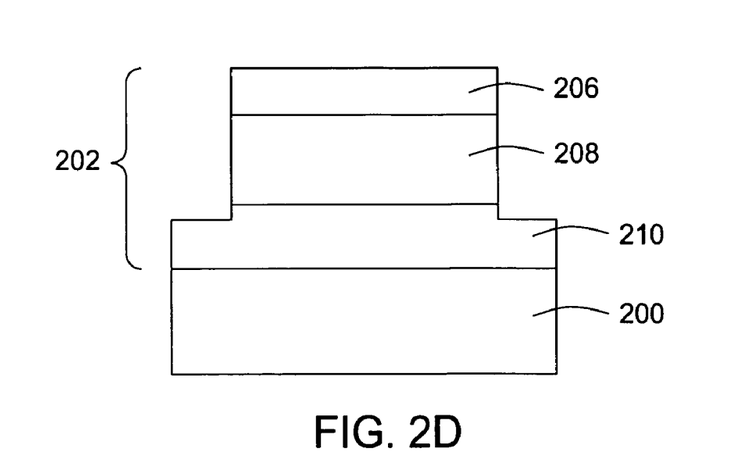

After the completion of step 106, at step 108, the mask 204 is removed, or stripped (FIG. 2D). The mask 204 may be stripped in any suitable conventional manner, such as with a plasma comprising oxygen ($O_2$), oxygen ($O_2$) and nitrogen ($N_2$), water ($H_2O$) vapor, carbon tetrafluoride ($CF_4$), and the like, and combinations thereof. The mask 204 may also be removed using an oxygen ($O_2$) based dry strip process with the addition of hydrogen ($H_2$). The hydrogen ($H_2$) added oxygen ($O_2$) strip process further facilitates the improvement of corrosion control as compared to non-$H_2$ added strip processes. Such improvement in corrosion control via the addition of hydrogen ($H_2$) to the strip process has been found to be significant.

Optionally, after the completion of the step 108, further processing of the substrate may continue. For example, at step 110 (shown in phantom) a wet strip process may be performed to remove any residue 216 that may remain on the film stack 202 and elsewhere on the substrate 200 and/or any residue that may remain as a result of stripping the mask 204. In one embodiment, step 110 may comprise dipping the substrate 200 in an aqueous solution including amine based or fluoride (F) based wet chemical solvent. Examples of such a process are described in further detail in the previously incorporated U.S. patent application Ser. No. 10/446,332. At step 112, the method 100 ends.

Figure 3:
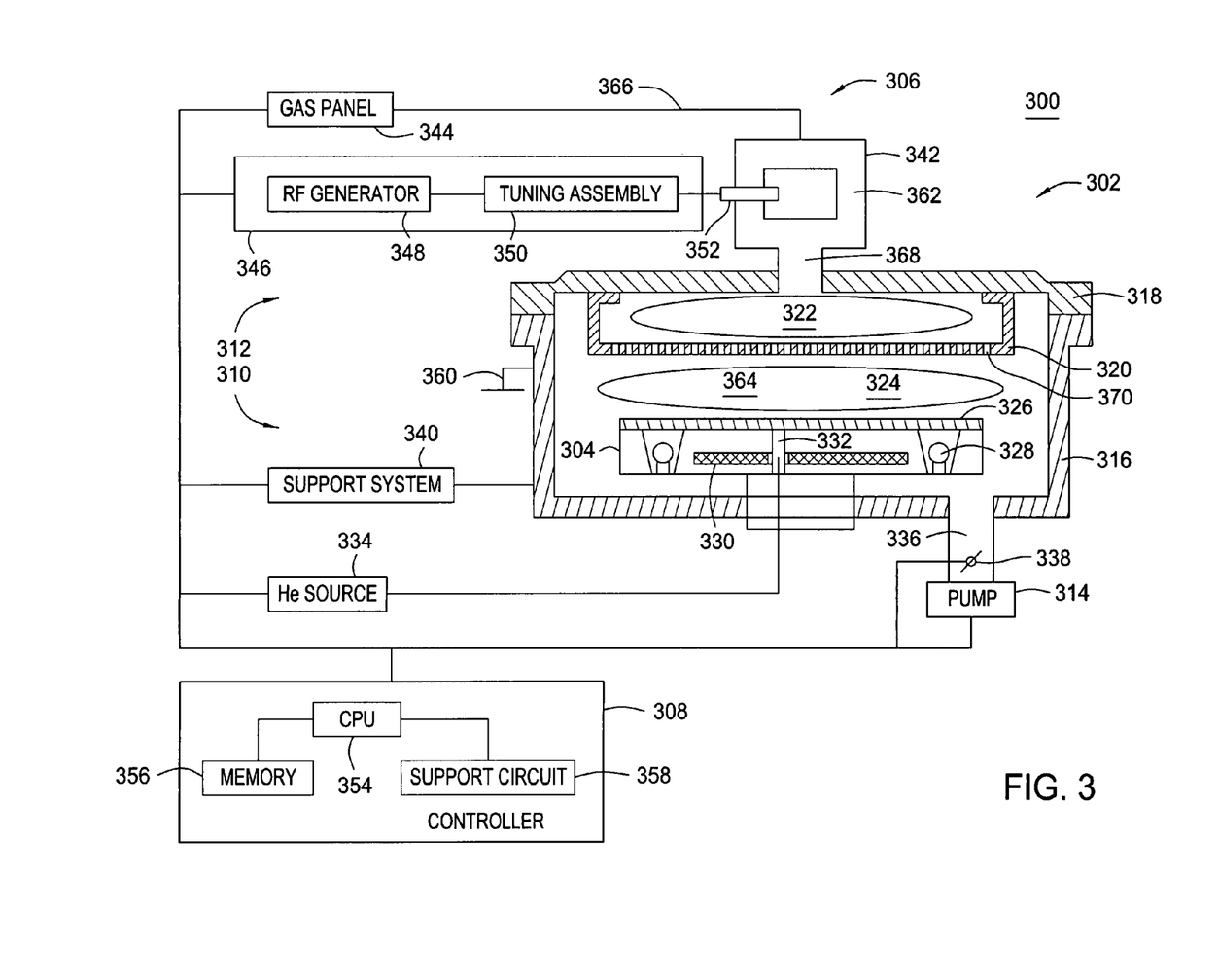
FIG. 3 depicts a schematic diagram of an exemplary plasma processing apparatus of the kind used in performing portions of the inventive method.

FIG. 3 depicts a schematic diagram of a reactor 300 that may be used to practice portions of the method 100. One example of a reactor 300 suitable for use with the present invention is an AXIOM® reactor, available from Applied Materials, Inc. of Santa Clara, Calif. The reactor 300 comprises a process chamber 302, a remote plasma source 306, and a controller 308.

The process chamber 302 generally is a vacuum vessel, which comprises a first portion 310 and a second portion 312. In one embodiment, the first portion 310 comprises a substrate pedestal 304, a sidewall 316 and a vacuum pump 314. The second portion 312 comprises a lid 318 and a gas distribution plate (showerhead) 320, which defines a gas mixing volume 322 and a reaction volume 324. The lid 318 and sidewall 316 are generally formed from a metal (e.g., aluminum (Al), stainless steel, and the like) and electrically coupled to a ground reference 360.

The substrate pedestal 304 supports a substrate (wafer) 326 within the reaction volume 324. In one embodiment, the substrate pedestal 304 may comprise a source of radiant heat, such as gas-filled lamps 328, as well as an embedded resistive heater 330 and a conduit 332. The conduit 332 provides a gas (e.g., helium) from a source 334 to the backside of the substrate 326 through grooves (not shown) in the substrate support surface of the pedestal 304. The gas facilitates heat exchange between the support pedestal 304 and the substrate 326. The temperature of the substrate 326 may be controlled between about 20 and 400 degrees Celsius.

The vacuum pump 314 is adapted to an exhaust port 336 formed in the sidewall 316 of the process chamber 302. The vacuum pump 314 is used to maintain a desired gas pressure in the process chamber 102, as well as evacuate the post-processing gases and other volatile compounds from the chamber. In one embodiment, the vacuum pump 314 comprises a throttle valve 338 to control a gas pressure in the process chamber 302.

The process chamber 302 also comprises conventional systems for retaining and releasing the substrate 326, detecting an end of a process, internal diagnostics, and the like. Such systems are collectively depicted as support systems 340.

The remote plasma source 306 comprises a power source 346, a gas panel 344, and a remote plasma chamber 342. In one embodiment, the power source 346 comprises a radio-frequency (RF) generator 348, a tuning assembly 350, and an applicator 352. The RF generator 348 is capable of producing up to 6,000 W at a frequency of about 200 to 600 kHz. The applicator 352 is inductively coupled to the remote plasma chamber 342 and energizes a process gas (or gas mixture) 364 to a plasma 362 in the chamber. In this embodiment, the remote plasma chamber 342 has a toroidal geometry that confines the plasma and facilitates efficient generation of radical species, as well as lowers the electron temperature of the plasma. In other embodiments, the remote plasma source 306 may be a microwave plasma source having a frequency of, for example, 1.5 GHz.

The gas panel 344 uses a conduit 366 to deliver the process gas 364 to the remote plasma chamber 342. The gas panel 344 (or conduit 366) comprises means (not shown), such as mass flow controllers and shut-off valves, to control gas pressure and flow rate for each individual gas supplied to the chamber 342. In the plasma 362, the process gas 364 is ionized and dissociated to form reactive species.

The reactive species are directed into the mixing volume 322 through an inlet port 368 in the lid 318. To minimize charge-up plasma damage to devices on the substrate 326, the ionic species of the process gas 364 are substantially neutralized within the mixing volume 322 before the gas reaches the reaction volume 324 through a plurality of openings 370 in the showerhead 320.

The controller 308 comprises a central processing unit (CPU) 354, a memory 356, and a support circuit 358. The CPU 354 may be of any form of a general-purpose computer processor used in an industrial setting. Software routines can be stored in the memory 356, such as random access memory, read only memory, floppy or hard disk, or other form of digital storage. The support circuit 358 is conventionally coupled to the CPU 354 and may comprise cache, clock circuits, input/output sub-systems, power supplies, and the like.

The software routines, when executed by the CPU 354, transform the CPU into a specific purpose computer (controller) 308 that controls the reactor 300 such that the processes are performed in accordance with the present invention. The software routines may also be stored and/or executed by a second controller (not shown) that is located remotely from the reactor 300.

The invention may be practiced in other semiconductor systems wherein the processing parameters may be adjusted to achieve acceptable characteristics by those skilled in the art by utilizing the teachings disclosed herein without departing from the spirit of the invention.

While the foregoing is directed to the illustrative embodiment of the present invention, other and further embodiments of the invention may be devised without departing from the basic scope thereof, and the scope thereof is determined by the claims that follow.

What is claimed is:

1. A method for controlling corrosion of a substrate, comprising:
    (a) providing a substrate having a patterned photoresist layer disposed atop an anti-reflection layer, the anti-reflection layer disposed atop a metal-containing layer, wherein the metal-containing layer is a conductive layer, and wherein the patterned photoresist has a metallic residue disposed thereon resultant from etching the pattern from the patterned photoresist layer into the metal-containing layer;
    (b) exposing the substrate to a hydrogen-based plasma to remove the metallic residue prior to removing the photoresist; and
    (c) removing the photoresist.

2. The method of claim 1, wherein the metallic residue comprises residue from etching at least one of aluminum (Al), copper (Cu), iron (Fe), or nickel (Ni).

3. The method of claim 1, wherein the hydrogen-based plasma comprises hydrogen ($H_2$).

4. The method of claim 3, wherein hydrogen ($H_2$) is supplied at a flow rate of between about 100-5,000 sccm.

5. The method of claim 3, wherein the hydrogen-based plasma further comprises nitrogen ($N_2$).

6. The method of claim 5, wherein nitrogen ($N_2$) is supplied at a flow rate of between about 1-1,000 sccm.

7. The method of claim 5, wherein hydrogen ($H_2$) is supplied at a flow rate of about 900 sccm and nitrogen ($N_2$) is supplied at a flow rate of about 300 sccm.

8. The method of claim 3, wherein the hydrogen-based plasma further comprises water ($H_2O$) vapor.

9. The method of claim 8, wherein water ($H_2O$) vapor is supplied at a flow rate of between about 1-3,000 sccm.

10. The method of claim 8, wherein hydrogen ($H_2$) is supplied at a flow rate of about 900 sccm and water ($H_2O$) vapor is supplied at a flow rate of about 300 sccm.

11. The method of claim 3, wherein the hydrogen-based plasma further comprises an inert gas.

12. The method of claim 11, wherein the inert gas comprises argon (Ar).

13. The method of claim 12, wherein argon (Ar) is supplied at a flow rate of between about 1-3,000 sccm.

14. The method of claim 12, wherein hydrogen ($H_2$) is supplied at a flow rate of about 900 sccm and argon (Ar) is supplied at a flow rate of about 900 sccm.

15. The method of claim 1, wherein the metallic residue further comprises a halogen compound from etching the metal-containing layer with a halogen-based process gas.

16. The method of claim 15, wherein the halogen comprises at least one of chlorine (Cl) or fluorine (F).

17. The method of claim 1, further comprising:
(d) exposing the substrate to a hydrogen-containing process gas for a first period of time sufficient to react with components of the residue prior to removing the photoresist.

18. The method of claim 17, wherein step (d) occurs prior to step (b)

19. The method of claim 18, further comprising:
(e) exposing the substrate to a hydrogen-containing process gas for a second period of time after step (b).

20. The method of claim 17, wherein step (d) occurs between step (b) and step (c).

21. The method of claim 1, wherein the metallic residue is resultant from an etch process in a process chamber and wherein step (b) further comprises:
exposing the substrate to the hydrogen-based plasma in the process chamber used to perform the etch process.

22. The method of claim 17, wherein the first period of time is between about 5 to about 40 seconds.

23. The method of claim 17, wherein the substrate is exposed to the hydrogen-based plasma for between about 10 to about 180 seconds.

24. The method of claim 1, wherein (a) further comprises:
etching the metal-containing layer using a halogen-based process gas, wherein the etch process forms the metallic residue; and
wherein (b) further comprises exposing the substrate the hydrogen-based plasma to remove the metallic residue while heating the substrate within the same process chamber as used in (a).

25. The method of claim 24, wherein the substrate is heated to a temperature of between about 100 and 400 degrees Celsius.

26. The method of claim 24, wherein the metallic residue comprises residue from etching at least one of aluminum (Al), copper (Cu), iron (Fe), or nickel (Ni).

27. The method of claim 1, further comprising:
d) etching through the metal-containing layer using a halogen-based process gas.

28. The method of claim 27, wherein the halogen-based process gas comprises a chlorine-based gas mixture.

29. The method of claim 27, wherein a barrier layer is disposed beneath the metal-containing layer, and wherein a shallow recess is formed in the barrier layer after etching through the metal-containing layer to facilitate complete removal of the metal-containing layer from the barrier layer in regions corresponding to the patterned photoresist layer.

30. The method of claim 1, wherein removing the photoresist further comprises:
removing the photoresist using an oxygen ($O_2$) based dry strip process with the addition of hydrogen ($H_2$).

* * * * *